(12) United States Patent
Flechsig et al.

(10) Patent No.: US 7,176,703 B2
(45) Date of Patent: Feb. 13, 2007

(54) TEST PROBE WITH THERMALLY ACTIVATED GRIP AND RELEASE

(75) Inventors: Karl Arthur Flechsig, Los Gatos, CA (US); Donald Ray Gillis, San Jose, CA (US); Sylvia Lui Lee, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/930,183

(22) Filed: Aug. 31, 2004

(65) Prior Publication Data

US 2006/0043994 A1    Mar. 2, 2006

(51) Int. Cl.
*G01R 31/02* (2006.01)
(52) U.S. Cl. .................... 324/754; 324/761
(58) Field of Classification Search ............ None
See application file for complete search history.

(56) References Cited

U.S. PATENT DOCUMENTS

| | | | |
|---|---|---|---|
| 3,996,511 A | 12/1976 | Baer | |
| 4,787,752 A * | 11/1988 | Fraser et al. | 374/45 |
| 5,387,872 A | 2/1995 | Nightingale | |
| 5,457,392 A | 10/1995 | Filipescu | |
| 5,801,441 A * | 9/1998 | DiStefano et al. | 257/696 |
| 5,893,713 A * | 4/1999 | Garman et al. | 433/32 |
| 5,906,628 A | 5/1999 | Miyawaki et al. | |
| 6,242,929 B1 * | 6/2001 | Mizuta | 324/754 |
| 6,504,223 B1 | 1/2003 | Zhou et al. | |
| 6,577,147 B2 * | 6/2003 | Ding et al. | 324/761 |
| 6,637,110 B2 * | 10/2003 | Jee | 29/890.031 |
| 2002/0002369 A1 | 1/2002 | Hood | |
| 2002/0052155 A1 | 5/2002 | Campbell et al. | |
| 2002/0105347 A1 | 8/2002 | Maruyama et al. | |
| 2002/0113612 A1 | 8/2002 | Nguyen | |
| 2003/0173944 A1 | 9/2003 | Cannon | |
| 2003/0224663 A1 | 12/2003 | Johnson et al. | |
| 2004/0024399 A1 | 2/2004 | Sharps et al. | |

FOREIGN PATENT DOCUMENTS

| | | | |
|---|---|---|---|
| CH | SU1598231 | * | 10/1990 |
| JP | 61215944 | * | 9/1986 |
| JP | 02-150773 | | 6/1990 |
| JP | 06-118099 | | 4/1994 |

OTHER PUBLICATIONS

Pomona Electronics Data Sheet, Model 6475, Test Probe Tips for 060 Series Probes.
Pomona Electronics Data Sheet, Model 5674b, Deluxe Electronic DMM Test Lead Kit.

* cited by examiner

*Primary Examiner*—Paresh Patel
*Assistant Examiner*—Roberto Velez
(74) *Attorney, Agent, or Firm*—D'Arcy H. Lorimer; Lorimer Labs (57) ABSTRACT

An electrical test probe has a thermally activated, configurable shape probe tip. At low temperatures, the probe tip is in a generally hooked configuration. Upon heating, the probe tip is converted to a generally straight configuration. The probe tip is composed of a spring component bonded to a shape memory alloy component. The straight configuration allows placement of the probe between tightly spaced circuit pins, while the hooked configuration provides for tight gripping of a circuit pin during measurement.

20 Claims, 9 Drawing Sheets

TEST PROBE WITH THERMALLY ACTIVATED GRIP AND RELEASE

BACKGROUND OF THE INVENTION

1. Field of the Invention

The present invention relates to the testing and monitoring of electronic circuits. More specifically, the present invention relates to test probes used to make measurements in electronic circuits.

2. Description of the Related Art

Figure 1A:
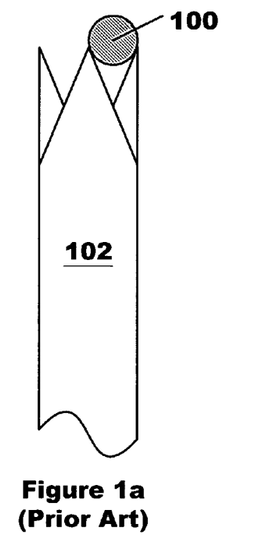
FIGS. 1a–1g (Prior Art) are partial side views of various probe configurations in common use.
Figure 1B:
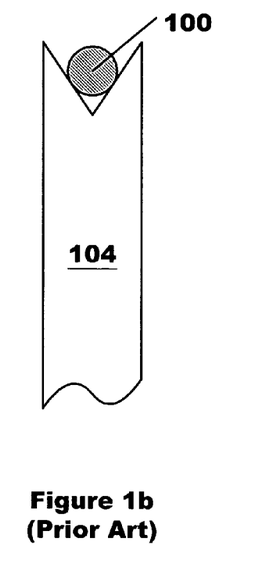
Figure 1C:
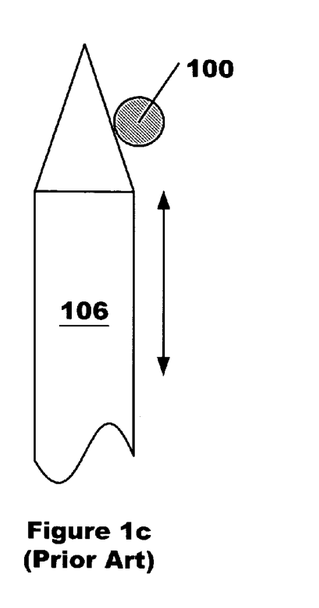
Figure 1D:
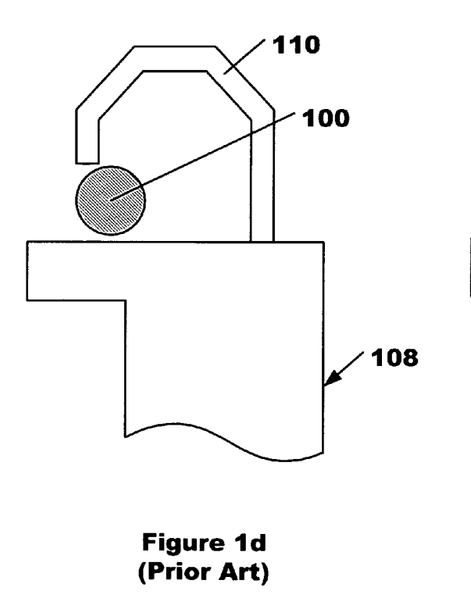
Figure 1E:
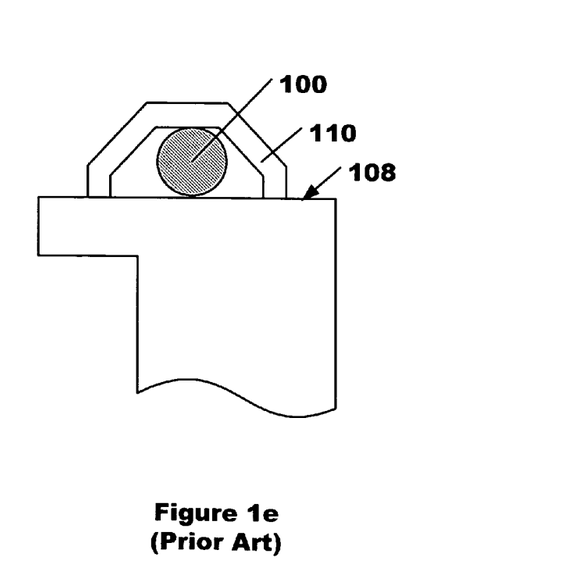
Figure 1F:
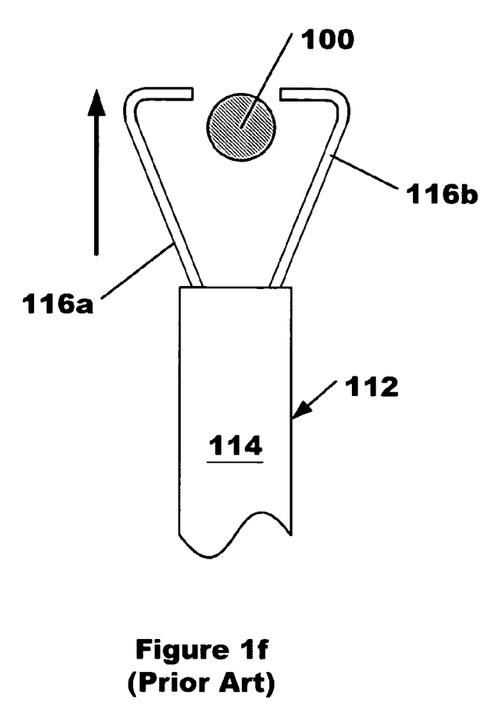
Figure 1G:
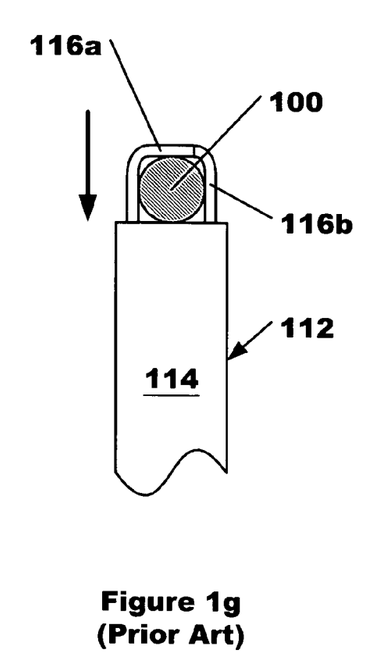

For the measurement of electronic parameters such as voltage, current, and resistance, many types of test probes have been developed. FIGS. 1a–g (Prior Art) are partial side views of various probe configurations in common use. FIG. 1c (Prior Art) illustrates one of the most common probe configurations, the simple needle type probe 106. While good for making contact with relatively flat surfaces, making measurements on small diameter pins, leads or wires 100 require a tangential contact with the pin's surface. The test probe is then subject to slippage while trying to make the measurement, potentially causing a short circuit with other pins or metal surfaces in the vicinity of the pin 100 being measured; loss of contact with desired test point is also possible. Probes more suitable for making measurements on pins are shown in FIGS. 1a and 1b (Prior Art). FIG. 1b illustrates a simple forked tip 104 which straddles the pin 100 being measured. This solution reduces the potential for disengagement while measuring the pin compared to the method of FIG. 1c, as long as the pin is less that the width of the probe tip. Larger pins cannot be easily accommodated, requiring multiple tips of varying sizes. Additionally, there remains the possibility of slipping along the surface of the pin 100, potentially contacting other nearby circuit components. The probe 102 shown in FIG. 1a is similar to that of FIG. 1b, but generally handles smaller pin diameters. The probes of FIGS. 1a–c have an additional disadvantage in that they require the use of at least one hand of an operator at all times while making a measurement. This "hands on" requirement limits the movement of an operator for making instrument adjustments during a measurement, or causes the operator to repeatedly break contact with the circuit being measured to adjust the meter or oscilloscope. This may lead to reduced productivity or errors when the operator has to repeatedly find a test point in closely spaced circuitry. A common configuration 108 that removes the "hands on" requirement is shown in FIGS. 1d and 1e (Prior Art). This type of probe employs a spring loaded hook 110 that must be opened (FIG. 1d) to capture pin 100. However, this type of probe is difficult to use when the measurement must be made on closely spaced pins or integrated circuit leads, since the spring loaded hook is often significantly larger than the pin diameter. This configuration is also not suitable for making measurements on flat printed circuit board traces. The springs and sliding parts are a source of reliability problems and complexity. Another common configuration of a gripping type of measurement probe 112 is shown in FIGS. 1f and 1g. In this probe spring loaded arms 116a and 116b extend from handle 114 to encircle pin 100. Upon retraction of arms 116a and 116b, pin 100 is captured and held against handle 114. This probe has similar disadvantages to the probe of FIGS. 1d and 1e. In particular, it is easy to short adjacent pins when the probe is in the open position of FIG. 1f, making it difficult to use on closely spaced pins. It is also not suitable for measuring circuit board traces.

Figure 2A:
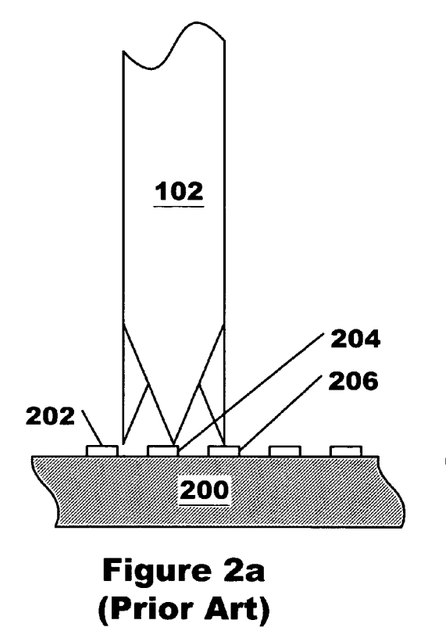
FIGS. 2a–2c (Prior Art) are partial side views of current art test probes probing printed circuit boards with closely spaced traces.
Figure 2B:
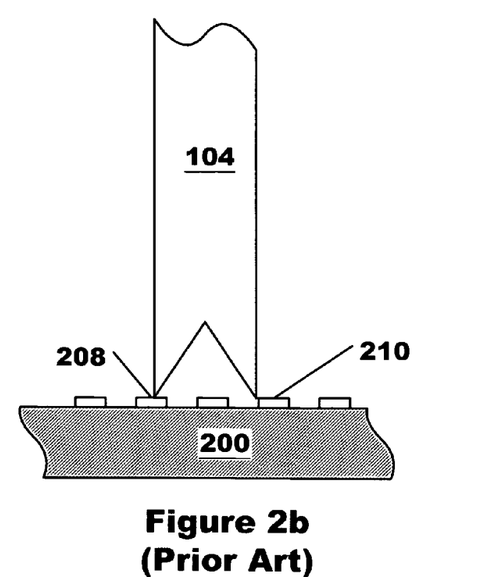
Figure 2C:
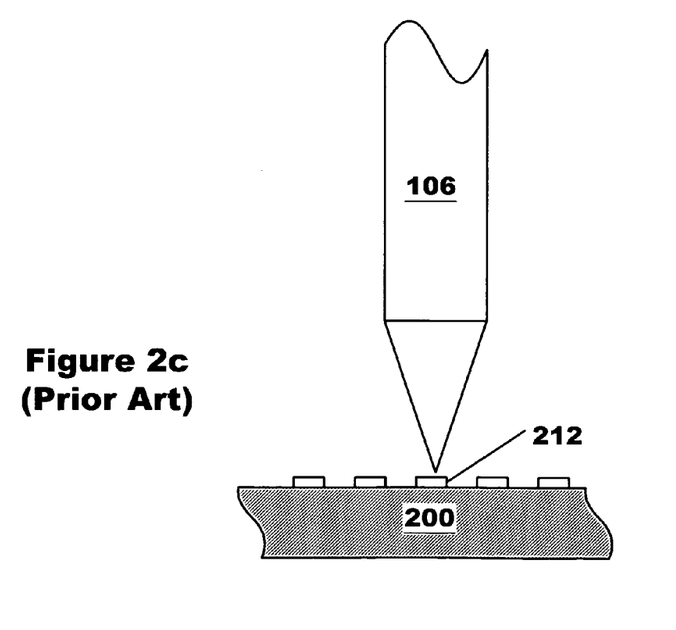

FIGS. 2a–2c (Prior Art) are partial side views of current art test probes probing printed circuit boards with closely spaced traces. Of the three configurations 102, 104, and 106, the simple needle probe 106 is best suited to measure circuit board trace 212 on circuit board 200. Forked tip probe 104 can easily short traces 208 and 210, unless the probe tip is made considerably smaller in diameter, which reduces its practicality for measuring a wide variety of pins. The same is true for probe tip 102, which can potentially short traces 202, 204, and 206 in FIG. 2a. So, while the simple needle probe 106 is good for circuit board traces, it is difficult to use on pins leads and wires. The forked tip configurations 102 and 104 are acceptable for pins, leads and wires with diameters less than the probe tip dimension, but they are not easily applied to measure closely spaced circuit board traces.

What is needed is a simple, flexible probe that can measure both pins and circuit board traces without causing shorts, grips pins tightly without slipping, provides "hands off" measurement capability, and has no wearable moving parts.

SUMMARY OF THE INVENTION

It is an object of the present invention to provide an electrical probe device comprising a probe tip that is generally straight at a first temperature, and generally hooked at a second temperature, wherein said first temperature is greater than said second temperature.

Its is another object of the present invention to provide a method for measuring electrical parameters by contact with a circuit pin, by providing an electrical probe device having a probe tip that is generally straight at a first temperature, and generally hooked at a second temperature, wherein said first temperature is greater than said second temperature. The method further includes heating the probe tip to the first temperature, contacting the circuit pin with the probe tip, and cooling the probe tip to the second temperature.

BRIEF DESCRIPTION OF THE DRAWINGS

The present invention will be better understood when consideration is given to the following detailed description thereof. Such description makes reference to the annexed drawings, wherein:

FIGS. 13a–13c are partial side views of a second method of fabricating a test probe tip according to an embodiment of the present invention; and, FIGS. 14a and 14b are cross sectional views through section B—B of FIGS. 12 and 13 according to embodiments of the present invention.

DETAILED DESCRIPTION OF THE PREFERRED EMBODIMENTS

FIGS. 1a–g (Prior Art) and FIGS. 2a–c (Prior Art) have been discussed in the Background section above.

Figure 3A:
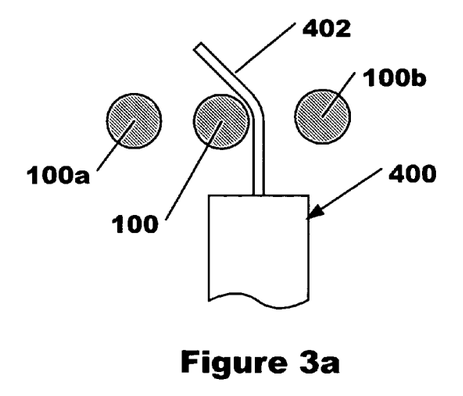
FIGS. 3a–3d are partial side views of a test probe measuring closely spaced integrated circuit pins according to an embodiment of the present invention.
Figure 3B:
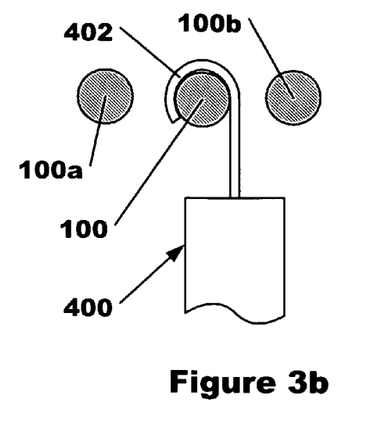
Figure 3C:
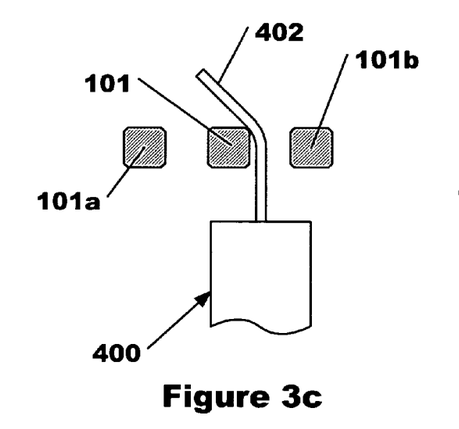
Figure 3D:
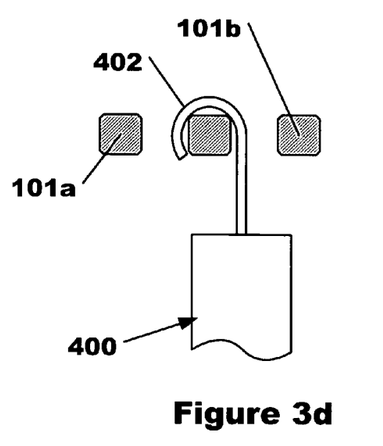

FIGS. 3a–3d are partial side views of a test probe 400 measuring closely spaced integrated circuit pins according to an embodiment of the present invention. The present invention includes a variable shape probe tip 402 that can move from a generally straight configuration as depicted in FIGS. 3a and 3c to a generally hooked configuration as depicted in FIGS. 3b and 3d. While in the generally straight configuration, the probe can be easily inserted between closely spaced circuit pins (for example, pins 100 and 100b in FIG. 3a; and pins 101 and 101b in FIG. 3c). After contacting the pin to be measured (for example pin 100 and pin 101), the probe can be transitioned to the generally hooked configuration to provide a tight grip on the pin being measured. Following the measurement, the probe tip 402 can be placed in the generally straight configuration to release the pin 100 or 101. The variable shaped probe tip 402 has a number of advantages over probe configurations of the prior art. It is easily inserted between closely spaced circuit pins while in the generally straight configuration, and grips the test pin tightly in the hooked configuration, allowing "hands off" measurement. The gripping capability reduces the possibility of slipping once engaged, minimizing short circuits or faulty measurements. Although the probe tip "moves" from straight to hooked shapes, it does so without mechanical parts that can wear out.

Figure 4:
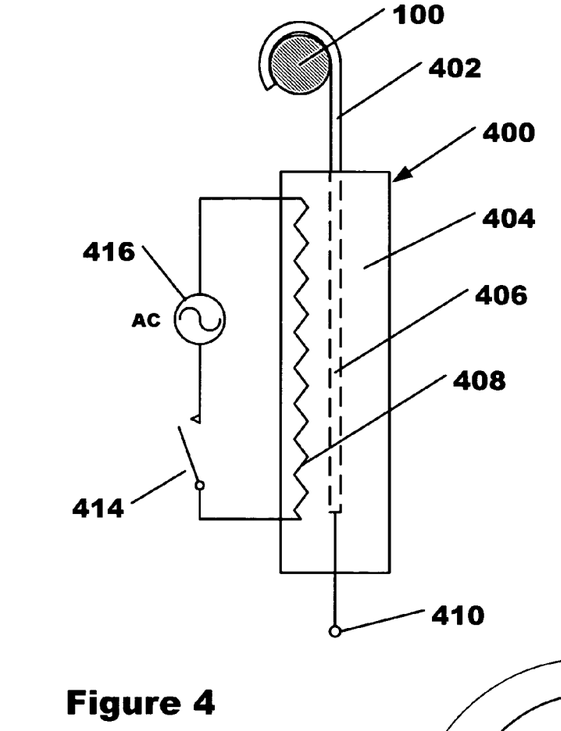
FIG. 4 is a schematic side view of a test probe gripping a test pin according to an embodiment of the present invention.

FIG. 4 is a schematic side view of a test probe 400 gripping a test pin 100 according to an embodiment of the present invention. Test probe 400 comprises a shape configurable test probe tip 402, insulating handle 404, heater 408, electrical and thermal conducting member 406, and measurement connection point 410. Test probe tip 402 is shown in the generally hooked configuration, so named because the test probe tip 402 is wrapped around the circuit pin 100. Test probe tip 402 assumes a configuration based upon the temperature of the tip. At low or nominally ambient temperatures, preferably below 30° C., the test probe tip 402 is in the generally hooked position. Upon heating the test probe tip 402 with, for example, heater element 408, test probe tip 402 moves to the generally straightened position. In the embodiment illustrated in FIG. 4, an AC power source 416 in concert with switch 414 is used to supply power to heater 408. However, as is well known to those skilled in the art, any electrical power source (such as DC or battery power) can be utilized to provide heat. Test probe tip 402 is both thermally and electrically coupled to member 406, which serves to transfer electrical signals to measurement point 410, as well as conduct thermal energy from the heater 408 to the tip 402. Switch 414 is in the open position when the heater element is off and the probe tip 402 is cold and in the hooked configuration. In an alternative embodiment, heater 408 is omitted, and the tip 402 is heated by a hot air source or a hot surface such as a soldering iron or hot plate. Handle 404 serves to insulate the user from the high temperatures generated by the heater as well as any voltage being measured by the probe tip 402.

Figure 5:
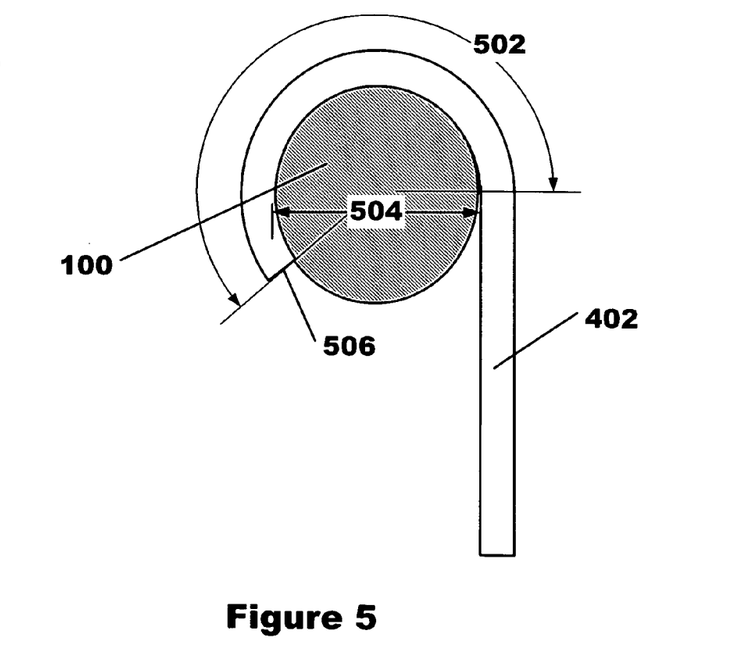
FIG. 5 is an expanded side view of probe tip 402 in FIG. 4 according to an embodiment of the present invention.

FIG. 5 is an expanded side view of probe tip 402 in FIG. 4 according to an embodiment of the present invention. Probe tip 402 is wrapped around test pin 100 in a generally hooked shape. Wrapping angle 502 defines the extent of the wrap of the probe tip 402 around a test pin of diameter 504. Angle 502 is measured from the central axis of probe tip 402 at handle 404 to the central axis at the end 506 of probe tip 402. Alternatively, the angle 502 can be measured from a plane normal to the central axis of probe tip 402 at handle 404 relative to a plane parallel with tip 506. Although some gripping capability is available for wrapping angles 502 less than 180 degrees, preferably angle 502 is greater than 180 degrees. More preferably, angle 502 is between about 180 degrees and 225 degrees.

Figure 6:
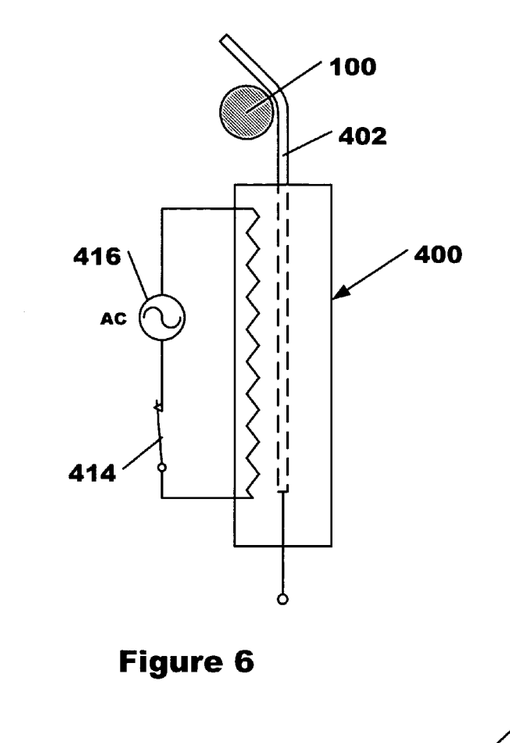
FIG. 6 is a schematic side view of a test probe tip in a straightened position according to an embodiment of the present invention.

FIG. 6 is a schematic side view of a test probe tip 402 in a straightened position according to an embodiment of the present invention. To place probe tip 402 in the generally straightened position, the probe tip 402 must be heated to an elevated temperature. In the embodiment shown in FIG. 6, electrical power is supplied by closing switch 414. The temperature required to straighten the tip is dependent on the shape memory alloy composition (discussed in detail below), but is preferably greater than about 45° C. As previously mentioned, alternative methods of heating probe tip 402 are also possible. The probe tip 402 is heated prior to contacting a circuit pin 100 for measurement, and then subsequent to making the measurement to release the grip on the circuit pin. Heating the probe tip 402 to place the tip in the straightened position may also be used to make measurements of circuit board traces as is shown in FIG. 8 below.

Figure 7:
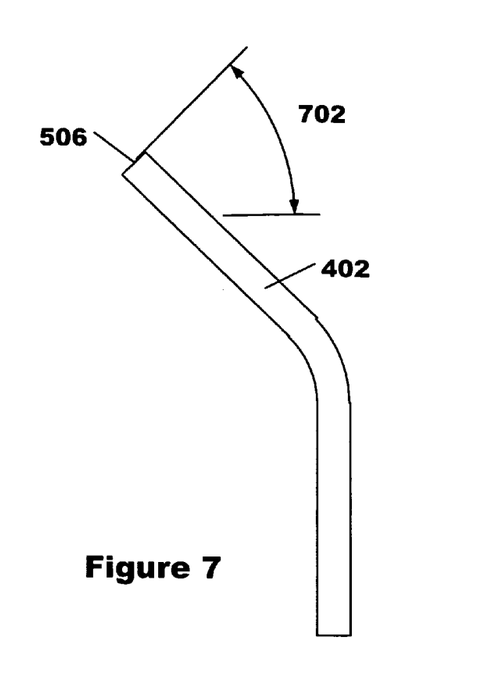
FIG. 7 is an expanded side view of probe tip 402 in FIG. 6 according to an embodiment of the present invention.

FIG. 7 is an expanded side view of probe tip 402 in FIG. 6 according to an embodiment of the present invention. Probe tip 402 is shown in the generally straightened position. Wrapping angle 702, is measured from the same reference points as angle 502. Angle 702 is between about 90 degrees and zero degrees, preferably between about 45 degrees and zero degrees.

Figure 8:
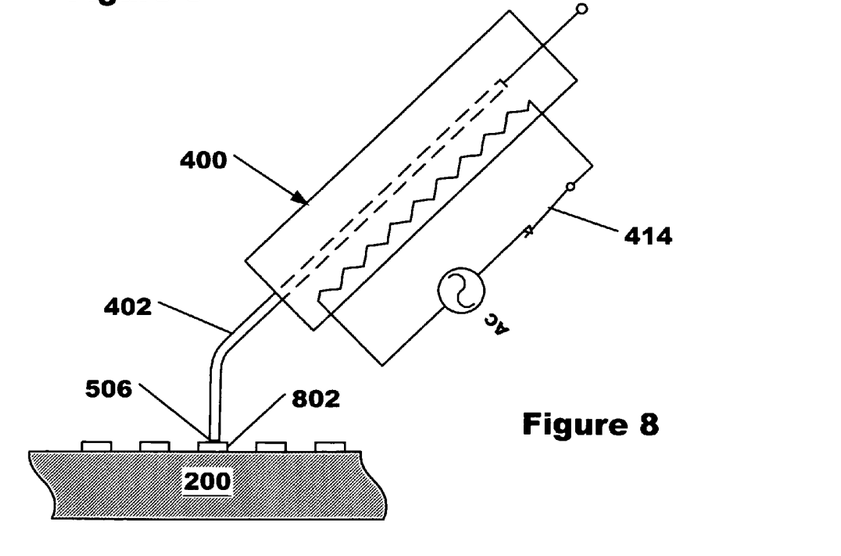
FIG. 8 is a schematic side view of a test probe measuring circuit board traces according to an embodiment of the present invention.

FIG. 8 is a schematic side view of a test probe 400 measuring circuit board traces 802 according to an embodiment of the present invention. Probe tip 402 is heated to place the probe tip in the straightened position. Measurement is made by contacting probe tip end 506 with, for example, circuit trace 802. For this application, the temperature of the probe tip is less than about 100° C., and preferably less than about 70° C., to avoid any thermal damage to devices being measured.

Figures 9, 10A, 10B, 11:
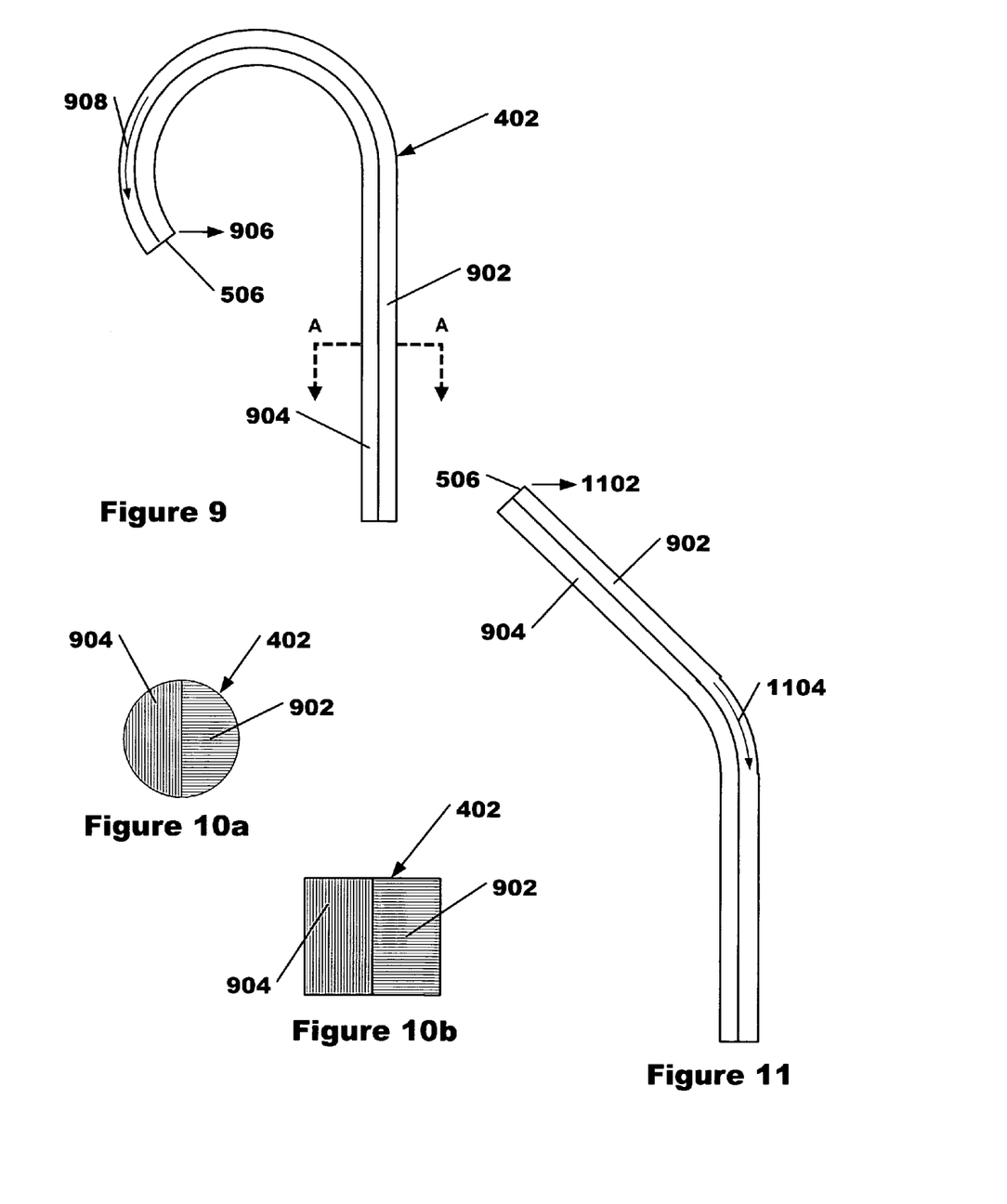
FIG. 9 is a partial side view of probe tip 402 in a hooked position according to an embodiment of the present invention.
FIGS. 10a and 10b are cross sectional views through section A—A in FIG. 9 according to an embodiment of the present invention.
FIG. 11 is a partial side view of probe tip 402 in the straightened position according to an embodiment of the present invention.

FIG. 9 is a partial side view of probe tip 402 in a hooked position according to an embodiment of the present invention. Probe tip 402 is composed of two types of materials bonded together. An inner component 904 is comprised of a conventional metal spring, fashioned such that its "unsprung" position is that of the hooked position. The outer component 902 is composed of a shape memory alloy. At low temperatures, the shape memory alloy is in the Martensite phase, which is relatively soft and easily deformed by spring 904. Spring 904, which is on the inner diameter of the probe tip 402, stretches and deforms the outer layer 902 in the direction of arrow 908 as tip 506 moves in direction 906. Shape memory alloys composed of Ni and Ti (nitinol); or Cu, Zn, Ni and Al can be used.

FIGS. 10a and 10b are cross sectional views through section A—A in FIG. 9 according to an embodiment of the present invention. Probe tip 402 may have circular or rectangular cross sections, or cross sections of other geometries such as elliptical shapes. Although the FIGS. 10a and 10b show cross sectional areas of component 902 and 904 as roughly equal, this need not be the case. Components 902 and 904 may be bonded together by any convenient technique, such as adhesives, fasteners, soldering or welding.

FIG. 11 is a partial side view of probe tip 402 in the straightened position according to an embodiment of the present invention. When probe tip 402 is heated, memory alloy 902 constricts in the direction of arrow 1104, overcoming the spring component 904, straightening tip 506 in direction 1102. This occurs as memory alloy 902 changes phase from Martensite to Austentite. Upon cooling of probe tip 402, memory alloy 902 again returns to the soft, easily deformed Martensitic state, allowing spring component 904 to return to its unstressed hook position.

Figure 12A:
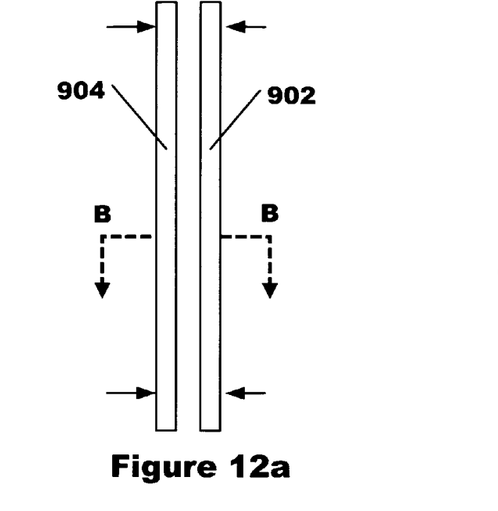
FIGS. 12a–12d are partial side views of a first method of fabricating a test probe tip according to an embodiment of the present invention.
Figure 12B:
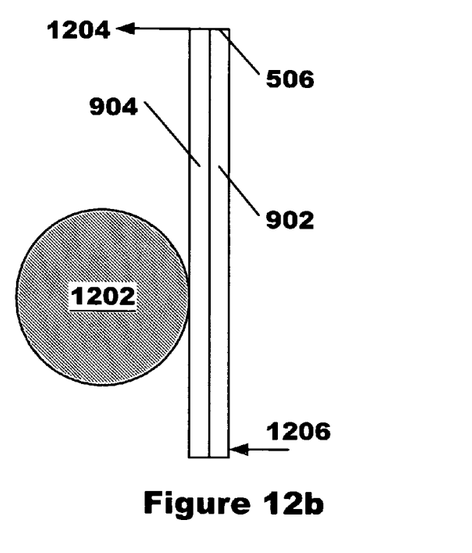
Figure 12C:
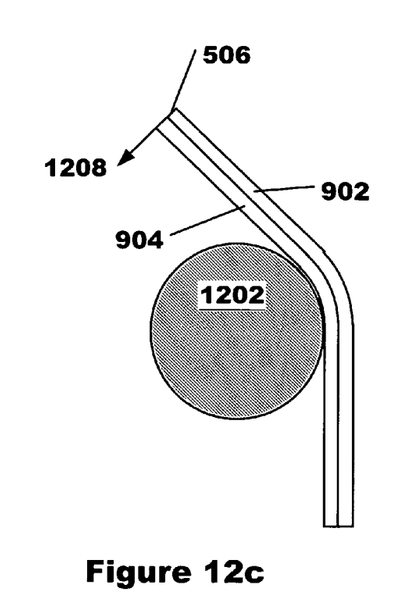
Figure 12D:
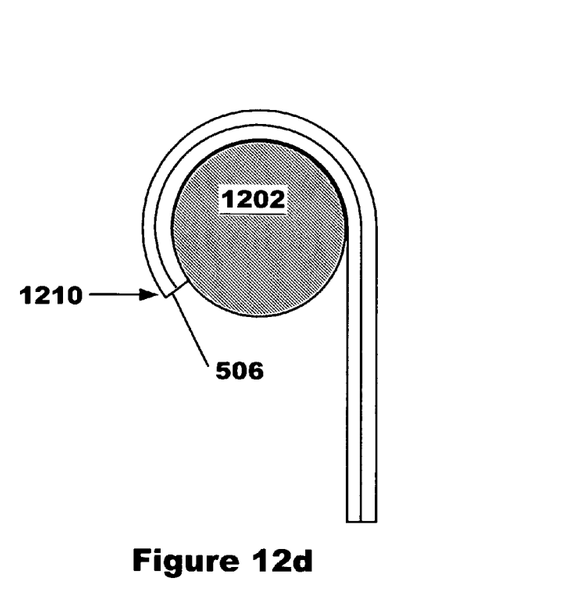

FIGS. 12a–12d are partial side views of a first method of fabricating a test probe tip according to an embodiment of the present invention. In FIG. 12a, an elongated bar spring 904 having a cross section shown in FIG. 14 a–b (below) is bonded to an approximately equal length section of memory alloy 902 at low temperature. Memory alloy 902 is in the non-deformed Martensite phase as it would be if recently converted from the Austentite phase in a free standing form. It retains the geometry (i.e. length) that it would have in the high temperature Austentite phase. In FIG. 12b, the bonded pair 904/902 is placed against a forming mandrel 1202, and a force 1204 is placed at tip 506. A retaining force 1206 is also applied. In FIG. 12c, the probe tip is deformed around mandrel 1202 by force 1208. In FIG. 12d, force 1210 completes the cold forming process. The cold forming process has stretched the memory alloy 902 into a low temperature deformed state, while forming a spring shaped as a hook. Upon heating, memory alloy 902 will return to the dimensions of the starting material of FIG. 12a, straightening the spring component 904.

Figures 13A, 13B:
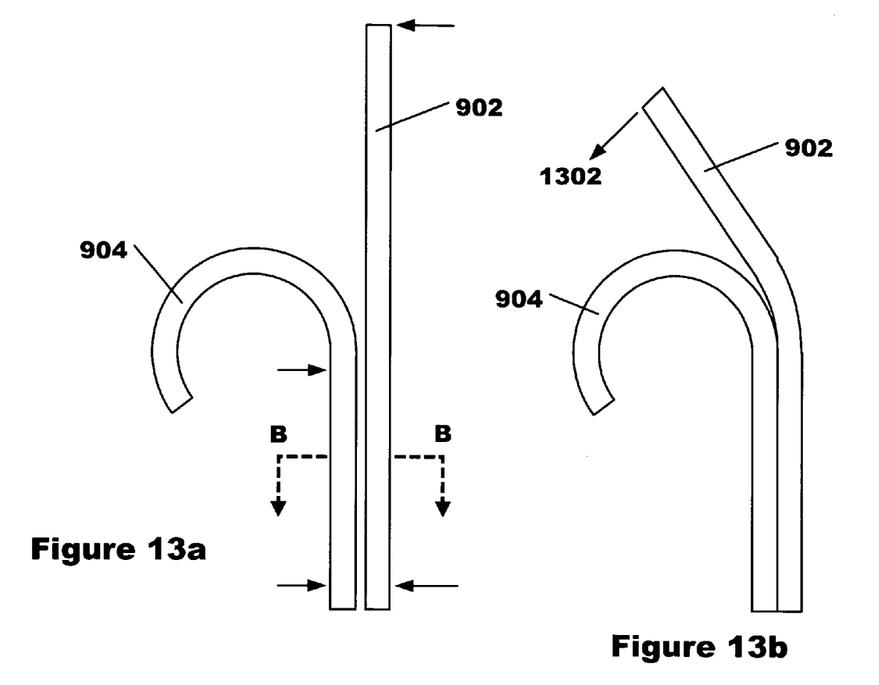
Figures 13C, 14A, 14B:
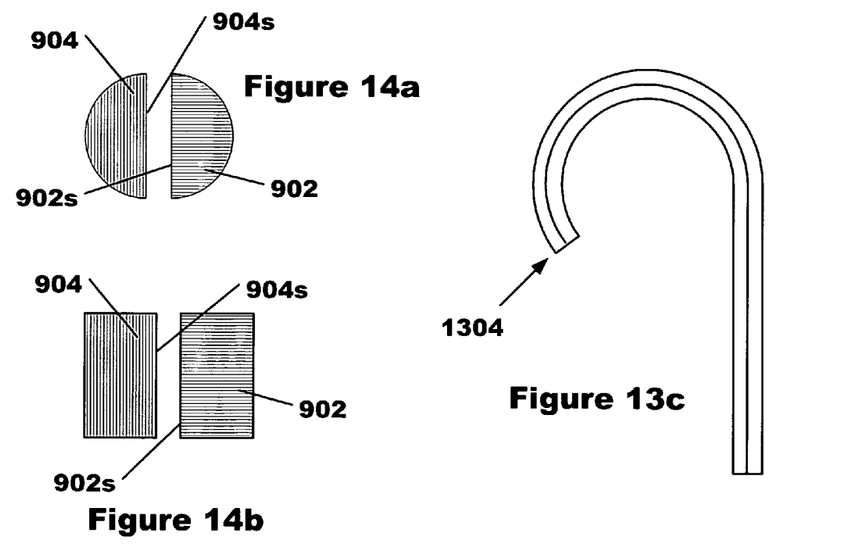

FIGS. 13a–13c are partial side views of a second method of fabricating a test probe tip according to an embodiment of the present invention. This method is an improvement over the previously described fabrication method of FIG. 12 in that it does not require cold forming of the spring on a mandrel. In FIG. 13a, a pre-formed spring 904 in the shape of a hook is paired with a straight section 902 of memory alloy in the low temperature, non-deformed Martensite phase. In FIG. 13b, parallel straight sections of the spring 902 and memory alloy 904 are bonded together at low temperature, and memory alloy 902 is deformed over the outer diameter of spring 904 by pulling the end of memory alloy component 902 in the direction of force 1302. In FIG. 13c, application of a force 1304 completes the process. Bonding of the curved interface between the two components 902 and 904 may take place during this process or subsequently thereafter.

FIGS. 14a and 14b are cross sectional views through section B—B of FIGS. 12 and 13 according to embodiments of the present invention. A bonding adhesive, solder, or other bonding agent may be applied to surfaces 904s and 902s to complete the mating of components 902 and 904. Mechanical fastening (not shown) may also be used on larger diameter probes. Welding may be utilized if it does not result in significant temperature increases of the probe components. Pulsed laser welding, for example, may be suitable.

The present invention is not limited by the previous embodiments heretofore described. Rather, the scope of the present invention is to be defined by these descriptions taken together with the attached claims and their equivalents.

What is claimed is:

1. An electrical probe device comprising:
   a probe tip being generally straight at a first temperature; and,
   said probe tip being generally hooked at a second temperature, wherein said first temperature is greater than said second temperature, and said probe tip is wrapped around said circuit pin at a wrapping angle greater than 180 degrees at said second temperature.

2. An electrical probe device as recited in claim 1, wherein said probe tip comprises a shape memory alloy.

3. An electrical probe as recited in claim 2, wherein said probe tip comprises an elongated member containing a shape memory alloy bonded to an elongated spring member.

4. An electrical probe device as recited in claim 2, wherein said shape memory alloy comprises Ni and Ti.

5. An electrical probe device as recited in claim 2, wherein said shape memory alloy comprises Cu, Al, and Ni.

6. An electrical probe device as recited in claim 2, wherein said shape memory alloy comprises Cu, Al, and Zn.

7. An electrical probe device as recited in claim 1, wherein said second temperature is less than 30 degrees Celsius.

8. An electrical probe device as recited in claim 1, wherein said first temperature is greater than 45 degrees Celsius.

9. An electrical probe device as recited in claim 1, wherein said probe tip is attached to a handle, and said probe tip is heated by an electrical heater in said handle.

10. An electrical probe device as recited in claim 1, wherein said probe tip is heated by hot air directed over said probe tip.

11. A method for measuring electrical parameters by contact with a circuit pin, comprising:
    providing an electrical probe having a probe tip that is generally straight at a first temperature, said probe tip being generally hooked at a second temperature, wherein said first temperature is greater than said second temperature;
    heating said probe tip to said first temperature;
    contacting said circuit pin with said probe tip; and,
    cooling said probe tip to said second temperature, said probe tip being wrapped around said circuit pin at a wrapping angle greater than 180 degrees.

12. The method as recited in claim 11, wherein said probe tip comprises a shape memory alloy.

13. The method as recited in claim 12, wherein said probe tip comprises an elongated member containing a shape memory alloy bonded to an elongated spring member.

14. The method as recited in claim 12, wherein said shape memory alloy comprises Ni and Ti.

15. The method as recited in claim 12, wherein said shape memory alloy comprises Cu, Al, and Ni.

16. The method as recited in claim 12, wherein said shape memory alloy comprises Cu, Al, and Zn.

17. The method as recited in claim 11, wherein said second temperature is less than 30 degrees Celsius.

18. The method as recited in claim 11, wherein said first temperature is greater than 45 degrees Celsius.

19. The method as recited in claim 11, wherein said probe tip is attached to a handle, and said probe tip is heated by an electrical heater in said handle.

20. The method as recited in claim 11, wherein said probe tip is heated by hot air directed over said probe tip.

* * * * *

UNITED STATES PATENT AND TRADEMARK OFFICE
CERTIFICATE OF CORRECTION

| | | |
|---|---|---|
| PATENT NO. | : 7,176,703 B2 | Page 1 of 1 |
| APPLICATION NO. | : 10/930183 | |
| DATED | : February 13, 2007 | |
| INVENTOR(S) | : Flechsig et al. | |

It is certified that error appears in the above-identified patent and that said Letters Patent is hereby corrected as shown below:

In claim 1, column 6, line 1, cancel the text beginning with "said probe tip" to and ending "second temperature" in column 6, line 5, and insert the following text:

--said probe tip being wrapped around a circuit pin at a second temperature, wherein said first temperature is greater than said second temperature, and said probe tip is wrapped around said circuit pin at a wrapping angle greater than 180 degrees at said second temperature.--

In claim 11, column 6, line 30, cancel the text beginning with "providing an" to and ending "second temperature" in column 6, line 34, and insert the following text:

--providing an electrical probe having a probe tip that is generally straight at a first temperature, said probe tip being wrapped around a circuit pin at a second temperature, wherein said first temperature is greater than said second temperature.--

Signed and Sealed this

Sixteenth Day of October, 2007

JON W. DUDAS
*Director of the United States Patent and Trademark Office*